United States Patent
Horiguchi et al.

(10) Patent No.: US 9,257,947 B2
(45) Date of Patent: Feb. 9, 2016

(54) SEMICONDUCTOR DEVICE

(71) Applicant: Mitsubishi Electric Corporation, Tokyo (JP)

(72) Inventors: Kenichi Horiguchi, Tokyo (JP); Masakazu Hirobe, Tokyo (JP); Satoshi Miho, Tokyo (JP); Yoshinobu Sasaki, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 30 days.

(21) Appl. No.: 14/314,116

(22) Filed: Jun. 25, 2014

(65) Prior Publication Data
US 2015/0091652 A1   Apr. 2, 2015

(30) Foreign Application Priority Data
Sep. 27, 2013 (JP) ................................ 2013-201250

(51) Int. Cl.
*H03F 3/68* (2006.01)
*H03F 3/195* (2006.01)
(Continued)

(52) U.S. Cl.
CPC ............. *H03F 3/195* (2013.01); *H03F 1/56* (2013.01); *H03F 3/245* (2013.01);
(Continued)

(58) Field of Classification Search
CPC .............. H03F 3/68; H03F 2200/111; H03F 2200/372; H03F 2200/294; H03F 3/211; H03F 3/72; H03F 1/0277; H03F 1/305; H03F 1/33; H03F 3/195; H03F 1/42; H03G 1/0088; H01L 29/7839

USPC .................. 330/51, 117, 126, 148, 301, 302
See application file for complete search history.

(56) References Cited

U.S. PATENT DOCUMENTS 5,930,607 A     7/1999 Satou
5,973,557 A *  10/1999 Miyaji et al. ................... 330/51
(Continued)

FOREIGN PATENT DOCUMENTS

JP    2001-161655 A    6/2001
JP    2004-193881 A    7/2004
(Continued)

OTHER PUBLICATIONS

Cheng et al.; "Challenges and Requirements of Multimode Multiband Power Amplifiers for Mobile Applications", *Compound Semiconductor Integrated Circuit Symposium (CSICS)*, pp. 1-4, (2011).

(Continued)

*Primary Examiner* — Khanh V Nguyen
(74) *Attorney, Agent, or Firm* — Leydig Voit & Mayer

(57) ABSTRACT

A semiconductor device includes a power amplifier for amplifying RF signals in multiple frequency bands, an output matching circuit connected to an output of the power amplifier, a first capacitor connected at a first end to an output of the output matching circuit, multiple output paths, a switch connected to a second end of the first capacitor and directing each of the RF signals to a respective one of the output paths in accordance with frequency band of the each of the RF signals, and multiple second capacitors. Each second capacitor is connected in series to a respective one of the output paths. The switch and either the first capacitor or the second capacitors, or both the first and second capacitors, are integrated as a single monolithic microwave integrated circuit.

16 Claims, 4 Drawing Sheets

(51) Int. Cl.
*H03F 1/56* (2006.01)
*H03F 3/24* (2006.01)

(52) U.S. Cl.
CPC .... *H03F 2200/111* (2013.01); *H03F 2200/222* (2013.01); *H03F 2200/387* (2013.01); *H03F 2200/414* (2013.01); *H03F 2200/429* (2013.01); *H03F 2200/451* (2013.01)

(56) References Cited

U.S. PATENT DOCUMENTS

| | | | |
|---|---|---|---|
| 6,317,608 B1* | 11/2001 | Glocker | 330/126 |
| 6,473,641 B1 | 10/2002 | Kodama et al. | |
| 7,679,438 B2* | 3/2010 | Tateoka et al. | 330/126 |
| 8,207,790 B2* | 6/2012 | Asada et al. | 330/302 |
| 8,587,373 B2* | 11/2013 | Sasaki et al. | 330/51 |
| 8,750,810 B2* | 6/2014 | Pletcher et al. | 330/51 |
| 2003/0201826 A1* | 10/2003 | Nakayama et al. | 330/51 |
| 2005/0206571 A1 | 9/2005 | Takenaka | |
| 2008/0088376 A1 | 4/2008 | Tateoka et al. | |
| 2008/0284539 A1 | 11/2008 | Tateoka et al. | |
| 2011/0003566 A1 | 1/2011 | Makihara et al. | |
| 2012/0087282 A1* | 4/2012 | Shibahara | 370/277 |

FOREIGN PATENT DOCUMENTS

| | | |
|---|---|---|
| JP | 2005-269129 A | 9/2005 |
| JP | 2008-118624 A | 5/2008 |
| JP | 2008-288769 A | 11/2008 |
| JP | 2011-15242 A | 1/2011 |
| KR | 2002-0015822 A | 3/2002 |
| WO | WO 97/13177 A1 | 4/1997 |
| WO | WO 2011/096027 A1 | 8/2011 |

OTHER PUBLICATIONS

Korean Patent Office; Office Action in Korean Patent Application No. 10-2014-0126555 (Jul. 17, 2015).

* cited by examiner

SEMICONDUCTOR DEVICE

BACKGROUND OF THE INVENTION

1. Field of the Invention

The present invention relates to a semiconductor device used, e.g., as a multiband amplifier for portable terminals.

2. Background Art

Japanese Laid-Open Patent Publication No. 2005-269129 discloses a switch circuit for directing RF signals in different frequency bands to respective different output paths. This switch circuit is configured of a plurality of field effect transistors.

Switches for portable terminals are typically configured of enhancement field effect transistors (FETs), since portable terminals use a single battery which supplies a positive potential. A positive DC bias voltage is applied between the drain and the source of each field effect transistor, and an RF signal passes along the path (or channel) between the drain and the source. Application of a positive voltage to the gate of the field effect transistor opens the channel between the drain and the source (that is, causes the channel to be conductive), whereas application of zero voltage to the gate closes the channel between the drain and the source (that is, causes the channel to be nonconductive).

It should be noted that DC blocking capacitors must be connected to the input and the outputs of each switch to prevent leakage of the DC bias voltage described above. The DC blocking capacitors described in the above publication are configured of surface mount device (SMD) components.

It is desirable to reduce the size of semiconductor devices as much as possible. In the case of semiconductor devices having a switch therein, however, the size of the DC blocking capacitors for the switch substantially contributes to the overall size of the semiconductor device if these DC blocking capacitors are configured of SMD components.

SUMMARY OF THE INVENTION

The present invention has been made to solve this problem. It is, therefore, an object of the present invention to provide a semiconductor device which has a switch therein and yet which has a relatively small size.

The features and advantages of the present invention may be summarized as follows.

According to one aspect of the present invention, a semiconductor device includes a power amplifier for amplifying RF signals in a plurality of frequency bands, an output matching circuit connected to an output of the power amplifier, a first capacitor connected at one end to an output of the output matching circuit, a plurality of output paths, a switch connected to the other end of the first capacitor and serving to direct each of the RF signals to a respective one of the plurality of output paths in accordance with a frequency band of the each of the RF signals, and a plurality of second capacitors each connected in series to a respective one of the plurality of output paths. The switch and either the first capacitor or the plurality of second capacitors or both are integrally formed as a single monolithic microwave integrated circuit.

According to another aspect of the present invention, a semiconductor device includes a power amplifier for amplifying RF signals in a plurality of frequency bands, an output matching circuit connected to an output of the power amplifier, a first capacitor connected at one end to an output of the output matching circuit, a plurality of output paths, a switch connected to the other end of the first capacitor and serving to direct each of the RF signals to a respective one of the plurality of output paths in accordance with a frequency band of the each of the RF signals, and a plurality of second capacitors each connected in series to a respective one of the plurality of output paths. A capacitance of the first capacitor is larger than a capacitance of any of the plurality of second capacitors.

Other and further objects, features and advantages of the invention will appear more fully from the following description.

DETAILED DESCRIPTION OF THE PREFERRED EMBODIMENTS

Figure 1:
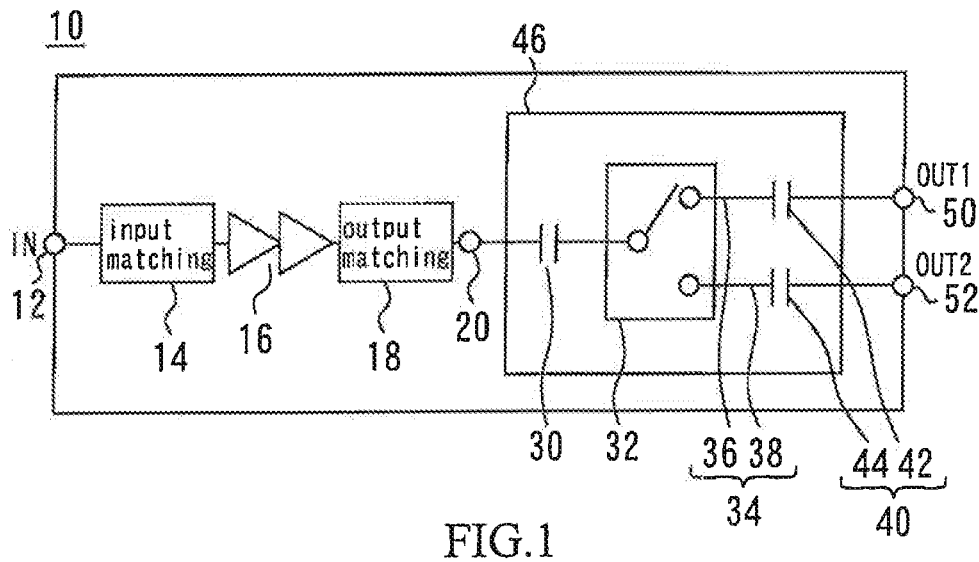
FIG. 1 is a circuit diagram of a semiconductor device in accordance with a first embodiment.

Semiconductor devices in accordance with embodiments of the present invention will be described with reference to the accompanying drawings. Throughout the specification the same or corresponding components are designated by the same reference numerals and may be described only once.

First Embodiment

FIG. 1 is a circuit diagram of a semiconductor device 10 in accordance with a first embodiment of the present invention. The semiconductor device 10 includes an input matching circuit 14 connected to its input terminal 12. A multistage power amplifier 16 for amplifying RF signals in a plurality of frequency bands is connected to the output of the input matching circuit 14.

An output matching circuit 18 is connected to the output of the power amplifier 16. One end of a first capacitor 30 is connected to the output of the output matching circuit 18 through an output terminal 20. A switch 32 is connected to the other end of the first capacitor 30. A plurality of output paths 34 (including the output paths 36 and 38) are connected to the respective outputs of the switch 32. Thus in this example, the number of output paths connected to the switch 32 (represented by N) is two; however, more than two output paths may be connected to the switch 32.

The switch 32 receives an RF signal and directs it to either the output path 36 or the output path 38 in accordance with a control signal. The switch 32 may be configured, e.g., of one or more enhancement FETs. More specifically, the switch 32 may be made up of a number of FETs corresponding to the number (N) of output paths (or the number of throws of the switch 32). In operation of the semiconductor device 10, a positive DC bias voltage is applied between the drain and the source of each FET, and zero or a positive voltage is applied to the gate of each FET. Specifically, when causing the switch 32 to direct the input RF signal to one of the output paths, a positive voltage is applied to the gate of the FET connected to that output path, so as to cause the channel between the drain and the source of the FET to assume its ON state, or conductive state. (When zero voltage is applied to the gate of each FET, the FET assumes its OFF state, or nonconductive state.) It should be noted that the switch 32 is preferably formed of high electron mobility transistors (HEMTs).

A plurality of second capacitors 40 (including second capacitors 42 and 44) are connected in series to the plurality of output paths 34. Specifically, in this example, the second capacitors 42 and 44 are connected in series to the output paths 36 and 38, respectively. Output terminals 50 and 52 are connected to the output ends of the output paths 36 and 38, respectively.

The first capacitor 30 and the plurality of second capacitors 40 serve to prevent the DC bias voltage applied between the source and the drain of each FET of the switch 32 from leaking to the power amplifier 16 or the output terminals 50 and 52. That is, the first capacitor 30 and the plurality of second capacitors 40 are DC blocking capacitors.

The first capacitor 30, the switch 32, and the plurality of second capacitors 40 are integrally formed as a single monolithic microwave integrated circuit (MMIC) 46. The first capacitor 30 and the plurality of second capacitors 40 are metal-insulator-metal (MIM) capacitors in the MMIC 46.

The MMIC 46 is preferably formed using an SOI (silicon on insulator) technique. That is, the MMIC 46 is preferably formed of, but not limited to, silicon on an insulating film.

Since the first capacitor 30, the switch 32, and the plurality of second capacitors 40 are integrally formed as a single MMIC, the semiconductor device can be smaller than would be the case if the first and second capacitors were SMD components.

Figure 2:
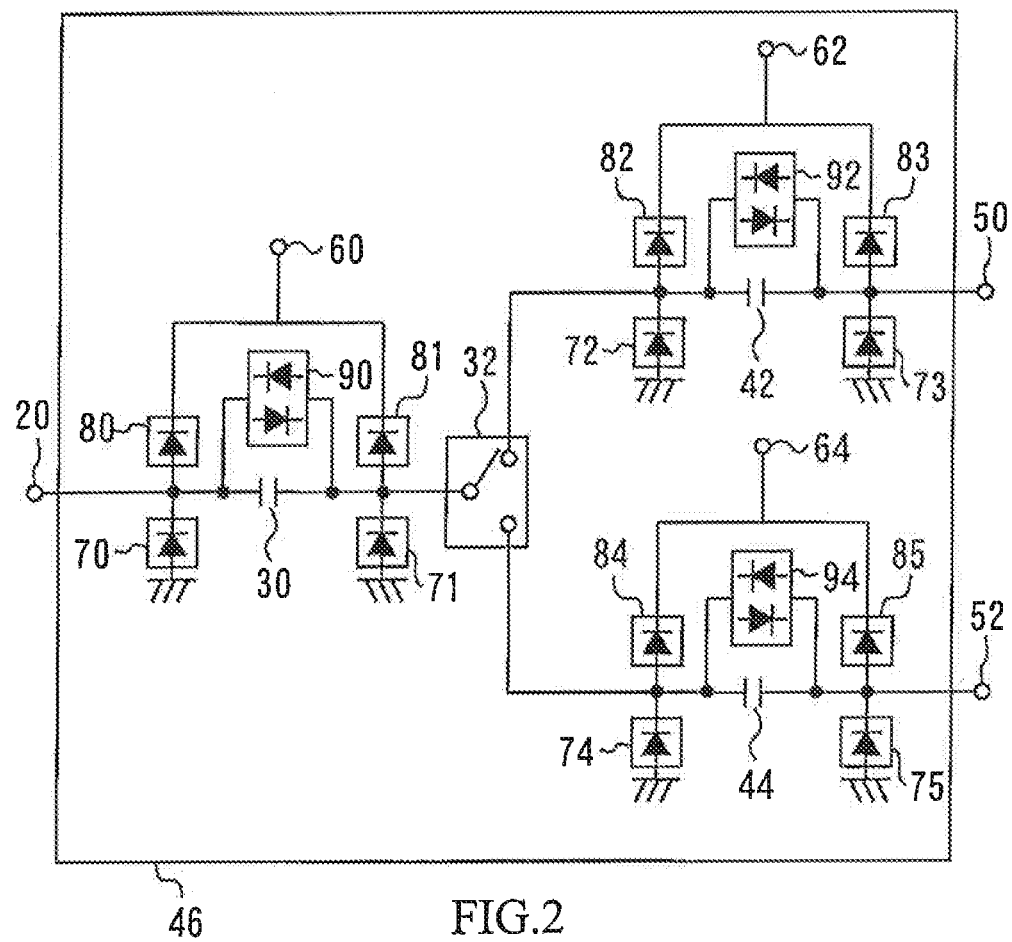
FIG. 2 is an enlarged view of the MMIC.

FIG. 2 is an enlarged view of the MMIC 46. FIG. 2 shows the structure of the MMIC 46 in more detail than FIG. 1. The MMIC 46 is provided with power terminals 60, 62, and 64 for applying DC voltages to the switch 32. The power terminals 60, 62, and 64 are electrically connected to the gate, source, and drain, respectively, of the switch 32, though not shown in FIG. 2.

In order to prevent degradation of the semiconductor device 10 due to static electricity, the MMIC 46 includes three types of protection circuits formed by diodes. Specifically, first protection circuits 70, 71, 72, 73, 74, and 75 are each connected between a signal path and ground to allow ESD surges to flow to ground, with the signal path transmitting the RF signal which has been input to the semiconductor device 10.

The first protection circuits 70 and 71 are connected to opposite ends of the first capacitor 30. The first protection circuits 72 and 73 are connected to opposite ends of the second capacitor 42. The first protection circuits 74 and 75 are connected to opposite ends of the second capacitor 44. For example, when an ESD surge occurs at the end of the first capacitor 30 connected to the first protection circuit 70, the first protection circuit 70 exhibits a zener breakdown phenomenon (or yield phenomenon), thereby causing the ESD surge to flow to ground.

Second protection circuits 80, 81, 82, 83, 84, and 85 are each connected between a signal path and a power terminal 60, 62, or 64. The second protection circuits 80 and 81 are connected to opposite ends of the first capacitor 30. The second protection circuits 82 and 83 are connected to opposite ends of the second capacitor 42. The second protection circuits 84 and 85 are connected to opposite ends of the second capacitor 44. For example, when an ESD surge occurs at a point between the power terminal 60 and the second protection circuits 80 and 81, the second protection circuits 80 and 81 and the first protection circuits 70 and 71 exhibit a zener breakdown phenomenon, thereby causing the ESD surge to flow to ground through the signal path and the first protection circuits 70 and 71.

Third protection circuits 90, 92, and 94 are connected in parallel with the first capacitor 30 and the second capacitors 42 and 44, respectively. Each of the third protection circuits 90, 92, and 94 includes parallel reverse-connected diodes.

For example, an ESD surge occurring at a point on the right side of the first capacitor 30, as viewed in FIG. 2, flows to ground through the first protection circuit 71 and through the third protection circuit 90 and the first protection circuit 70.

Thus, the protection circuits made up of diodes and connected to the first capacitor 30 and the plurality of second capacitors 40 serve to prevent degradation of the semiconductor device 10 due to ESD surges. It should be noted that the first to third protection circuits may be formed by FETs instead of diodes.

The operation of the semiconductor device 10 will be described. An RF signal is input to the input terminal 12 of the semiconductor device 10 and amplified by the power amplifier 16 of the device. The amplified RF signal is then input to the switch 32, which directs the RF signal to one of the plurality of output paths 34 (in this example, either the output path 36 or 38) in accordance with the frequency band of the RF signal.

It should be noted that in a semiconductor device similar to the semiconductor device 10 of the first embodiment but without the first capacitor 30 and the plurality of second capacitors 40, the output matching circuit 18 is typically configured so that the output impedance (roughly 5Ω) of the last stage transistor of the power amplifier 16 is matched to 50Ω through the output matching circuit 18, since the load impedance as seen looking from the output of the output matching circuit 18 (or the output terminal 20) toward the output terminals 50 and 52 is 50Ω. In the case of the semiconductor device 10 of the first embodiment, on the other hand, the load impedance as seen looking from the output of the output matching circuit 18 (or the output terminal 20) toward the output terminals 50 and 52 is a capacitive impedance of 50+jY Ω, since the first capacitor 30 is connected to the input of the switch 32 and the plurality of second capacitors 40 are connected to the outputs of the switch 32. Therefore, in order to match the output impedance of the last stage transistor of the power amplifier 16 through the output matching circuit 18 to the load impedance (50+jY Ω), the impedance matching ratio (or impedance conversion ratio) of the output matching circuit 18 must be higher than would be required without the first capacitor 30 and the plurality of second capacitors 40. It should be noted that an increase in the impedance matching ratio of the output matching circuit 18 typically requires an increase in the size and the power loss of the output matching circuit 18.

This means that in order to reduce the size and power loss of the output matching circuit 18, it is necessary to reduce the required impedance matching ratio of the output matching circuit 18, which may be accomplished by increasing the combined capacitance of the first capacitor 30 and the plurality of second capacitors 40. Since these capacitors are MIM capacitors and, therefore, their capacitance is proportional to their surface area, the combined capacitance of the capacitors may be increased by increasing the surface area of each capacitor. This, however, results in increased size of the semiconductor device 10. That is, there is a trade-off between reducing the size and power loss of the output matching circuit 18 and reducing the size of the first and second capacitors.

In order to overcome this trade-off, the semiconductor device 10 of the first embodiment is configured in such a manner that the capacitance of the first capacitor 30 is greater than the capacitance of any of the plurality of second capacitors 40. This makes it possible to increase the combined capacitance of the first capacitor 30 and the plurality of second capacitors 40 without increasing the sum of the areas of these capacitors. Specifically, the capacitance $C_{IN}$ of the first capacitor 30 and the capacitances $C_{OUT}$ of the plurality of second capacitors 40 are represented by the following equations:

$$C_{IN} = C_{AVE} + N \cdot \Delta C \qquad \text{Equation 1}$$

$$C_{OUT\_k} = C_{AVE} - \Delta C \qquad \text{Equation 2}$$

$$C_{AVE} = \frac{C_{IN} + \sum_{k=1}^{N} C_{OUT\_k}}{N + 1} \qquad \text{Equation 3}$$

where: N is the number of throws of the switch 32 (or the number of the plurality of output paths 34) and is equal to the number of the plurality of second capacitors 40; k is 1, 2, ..., N; $C_{AVE}$ is the average capacitance of the first capacitor 30 and the plurality of capacitors 40; and $\Delta C$ is a selected offset capacitance value.

Figure 3:
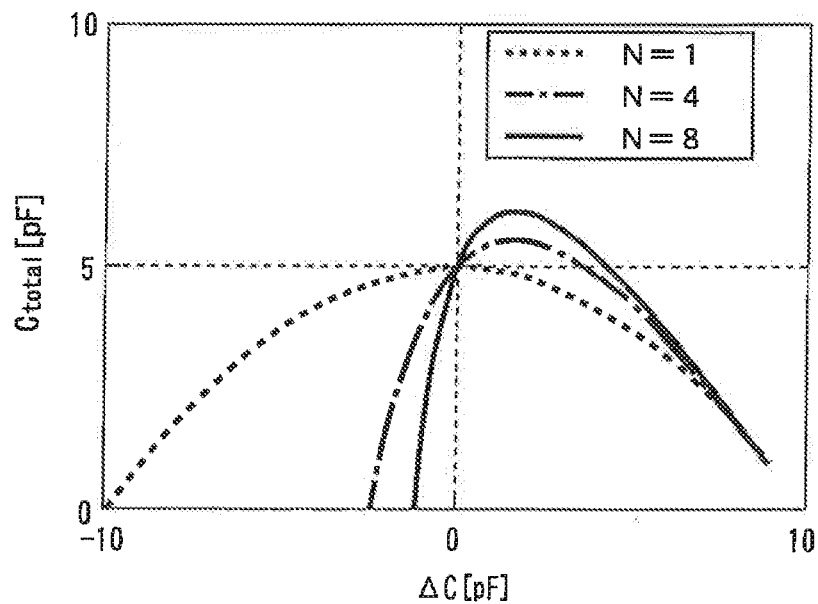
FIG. 3 is a graph showing the combined capacitance $C_{TOTAL}$ of the first capacitor and the plurality of second capacitors as a function of the offset capacitance value $\Delta C$.

FIG. 3 is a graph showing the combined capacitance $C_{TOTAL}$ of the first capacitor 30 and the plurality of second capacitors 40 as a function of the offset capacitance value $\Delta C$ for different numbers N of throws of the switch 32 when the average capacitance $C_{AVE}$ is 5 pF with the sum of the areas of the first and second capacitors being a fixed predetermined value. As shown, when the number N of throws of the switch 32 is 1, the combined capacitance $C_{TOTAL}$ of the first capacitor 30 and the plurality of second capacitors 40 is maximized to be 5 pF at $\Delta C = 0$. When the number N of throws of the switch 32 is greater than 1, the combined capacitance $C_{TOTAL}$ is maximized to be greater than 5 pF at $\Delta C = C_{OPT}$, where $C_{OPT}$ is a value greater than 0. Therefore, the capacitance $C_{IN}$ of the first capacitor 30 and the capacitances $C_{OUT}$ of the plurality of second capacitors 40 should preferably be selected so that $\Delta C = C_{OPT}$ in order to maximize the combined capacitance $C_{TOTAL}$ of these first and second capacitors.

The value $C_{OPT}$ is given by the following equation:

$$C_{OPT} = \left\{ \frac{(N+1)\sqrt{N} - 2N}{N \cdot (N-1)} \right\} \cdot C_{AVE} \qquad \text{Equation 4}$$

Thus, the capacitance $C_{IN}$ of the first capacitor 30 and the capacitances $C_{OUT}$ of the plurality of second capacitors 40 may be selected so that $\Delta C = C_{OPT}$. This results in the combined capacitance $C_{TOTAL}$ of the first capacitor 30 and the plurality of second capacitors 40 being greater than is the case when these capacitors have the same capacitance, assuming that the sum of the areas of these capacitors is the same in both cases. An increase in the combined capacitance $C_{TOTAL}$ allows a decrease in the impedance matching ratio of the output matching circuit 18, making it possible to reduce the size and power loss of the output matching circuit 18.

Therefore, the configuration of the semiconductor device 10 of the first embodiment makes it possible to reduce the size of the first capacitor 30 and the plurality of second capacitors 40 without increasing the size and power loss of the output matching circuit 18. It should be noted that a decrease in the power loss of the output matching circuit 18 improves the overall power efficiency of the semiconductor device 10 for handling RF signals. Therefore, the semiconductor device 10 may be used, e.g., in portable terminals to extend the battery duration.

Substitution of the above Equation 4 (giving the value $C_{OPT}$) into Equations 1 and 2 leads to the following equation:

$$C_{IN} = \sqrt{N} \cdot C_{OUT\_k} \qquad \text{Equation 5}$$

Figure 4:
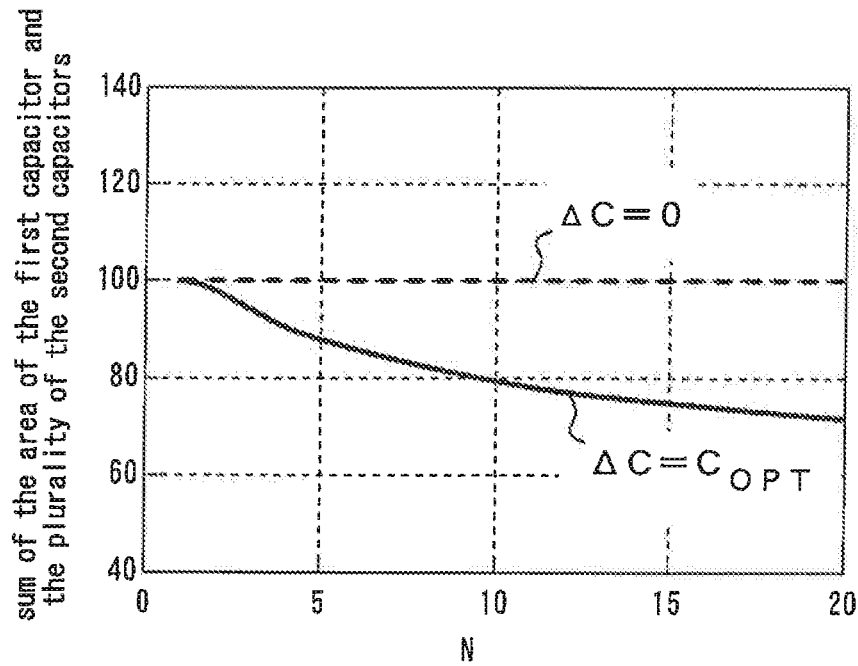
FIG. 4 is a graph showing the sum of the areas of the first capacitor and the plurality of second capacitors as a function of the number N of throws of the switch.

Thus, in accordance with the present embodiment, the capacitance $C_{IN}$ of the first capacitor 30 and the capacitances $C_{OUT}$ of the plurality of second capacitors 40 are selected so that $\Delta C = C_{OPT}$. This arrangement results in the combined capacitance $C_{TOTAL}$ of the first capacitor 30 and the plurality of second capacitors 40 being greater than is the case when these capacitors have the same capacitance (i.e., $\Delta C = 0$) if the sum of the areas of these capacitors is the same in both cases, as described above. Alternatively, the above arrangement results in the sum of the areas of the first capacitor 30 and the plurality of second capacitors 40 being smaller than is the case when these capacitors have the same capacitance (i.e., $\Delta C = 0$) if the combined capacitance $C_{TOTAL}$ of these capacitors is the same in both cases. FIG. 4 is a graph showing the sum of the areas of the first capacitor 30 and the plurality of second capacitors 40 as a function of the number N of throws of the switch 32 for different values of the offset capacitance value $\Delta C$ with the combined capacitance $C_{TOTAL}$ of these first and second capacitors being a fixed predetermined value. In FIG. 4, the sum of the areas of the first capacitor 30 and the plurality of second capacitors 40 when $\Delta C = 0$ is scaled to be 100. The curve indicated by the symbol $\Delta C = C_{OPT}$ shows the sum of the areas of the first capacitor 30 and the plurality of second capacitors 40 when $\Delta C = C_{OPT}$ (that is, when Equation 5 above is satisfied), indicating that the sum is smaller than is the case when $\Delta C = 0$ if the combined capacitance $C_{TOTAL}$ of these first and second capacitors is the same in both cases. This reduction in the sum of the areas of the capacitors makes for a reduction in the size of the semiconductor device 10.

Thus, in accordance with the first embodiment, the capacitance $C_{IN}$ of the first capacitor 30 and the capacitances $C_{OUT}$ of the plurality of second capacitors 40 are selected so that $\Delta C = C_{OPT}$. This arrangement provides two alternative advantages: 1) the combined capacitance $C_{TOTAL}$ of these first and second capacitors is greater than is the case when $\Delta C = 0$ if the sum of the areas of the first and second capacitors is the same in both cases; or 2) the sum of the areas of the first and second capacitors is smaller than is the case when $\Delta C = 0$ if the combined capacitance $C_{TOTAL}$ of these first and second capacitors is the same in both cases. These advantages help reduce the size of the semiconductor device.

The capacitance $C_{IN}$ of the first capacitor 30 and the capacitances $C_{OUT}$ of the plurality of second capacitors 40 are preferably selected to satisfy Equation 5 above in order to maximize the combined capacitance $C_{TOTAL}$ of these first and second capacitors. However, the capacitances $C_{IN}$ and $C_{OUT}$ need not necessarily satisfy Equation 5 as long as the advantages of the first embodiment described above are retained. Specifically, the capacitances $C_{IN}$ and $C_{OUT}$ may be permitted to vary within a certain acceptable tolerance range determined based on manufacturing process variations of the semiconductor device 10. For example, $C_{IN}$ and $C_{OUT}$ may be selected to satisfy the following equation:

$$0.80\sqrt{N} \cdot C_{OUT\_k} \leq C_{IN} \leq 1.2\sqrt{N} \cdot C_{OUT\_k} \qquad \text{Equation 6}$$

The semiconductor device 10 of the first embodiment has two features which serve to reduce its size. A first feature is that the first capacitor 30, the switch 32, and the plurality of second capacitors 40 are integrally formed as a single MMIC. A second feature is that the capacitance $C_{IN}$ of the first capacitor 30 is greater than the capacitances $C_{OUT}$ of the plurality of second capacitors 40 (i.e., the selected offset capacitance value $\Delta C > 0$). This second feature provides two alternative advantages: 1) the combined capacitance $C_{TOTAL}$ of the first capacitor 30 and the plurality of second capacitors 40 is greater than is the case when these first and second capacitors have the same capacitance (i.e., $\Delta C = 0$) if the sum of the areas of the first and second capacitors is the same in both cases, making it possible to reduce the size and power loss of the output matching circuit 18; or 2) the sum of the areas of the first and second capacitors is smaller than is the case when $\Delta C = 0$ if the combined capacitance $C_{TOTAL}$ of the first and second capacitors is the same in both cases. Other embodiments of the present invention may provide a small-sized semiconductor device having either the above first or second feature.

Although in the first embodiment the first capacitor 30, the switch 32, and the plurality of second capacitors 40 are integrally formed as a single MMIC, it is to be understood that in other embodiments the switch 32 and either the first capacitor 30 or the plurality of capacitors 40 or both may be integrally formed as a single MMIC. Other suitable alterations may be made to the configuration of the semiconductor device 10 of the first embodiment while retaining the features of the invention described above. It should be noted that these alterations may also be made to the semiconductor device of the second embodiment described below.

Second Embodiment

Figure 5:
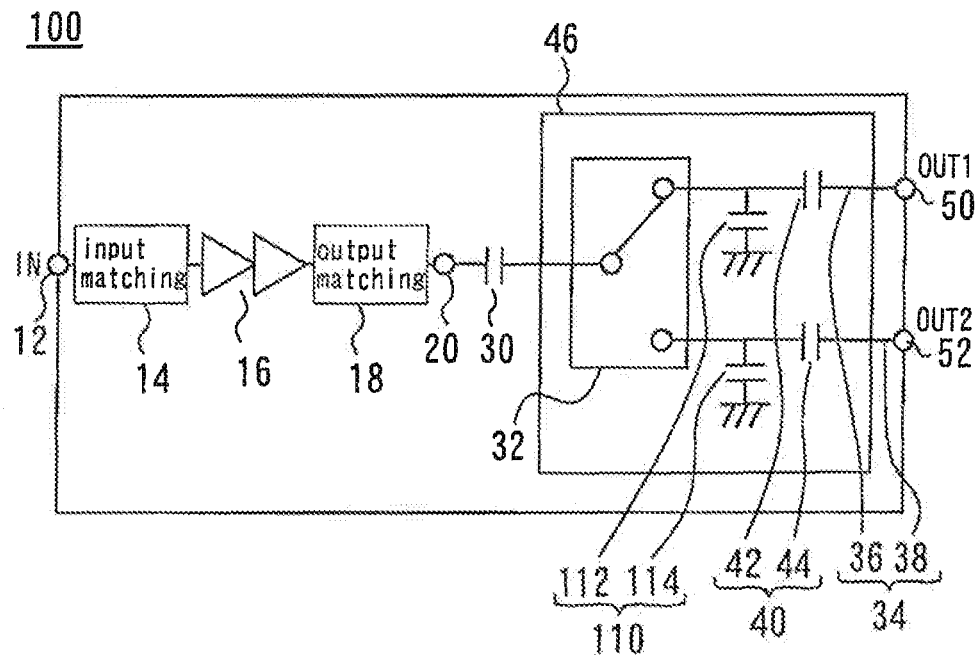
FIG. 5 is a circuit diagram of the semiconductor device of the second embodiment.

The semiconductor device of the second embodiment has many features common to the semiconductor device of the first embodiment. Therefore, the following description of the second embodiment will be primarily limited to the differences from the first embodiment. FIG. 5 is a circuit diagram of the semiconductor device of the second embodiment. This semiconductor device, labeled with reference numeral 100 in FIG. 5, includes a plurality of third capacitors 110 (including a third capacitor 112 and a third capacitor 114). The third capacitor 112 is connected between the output path 36 and ground, and the third capacitor 114 is connected between the output path 38 and ground.

The capacitances of the second capacitor 42 and the third capacitor 112 are selected such that the output path 36 exhibits good RF characteristics. The capacitances of the second capacitor 44 and the third capacitor 114 are selected such that the output path 38 exhibits good RF characteristics.

Figure 6:
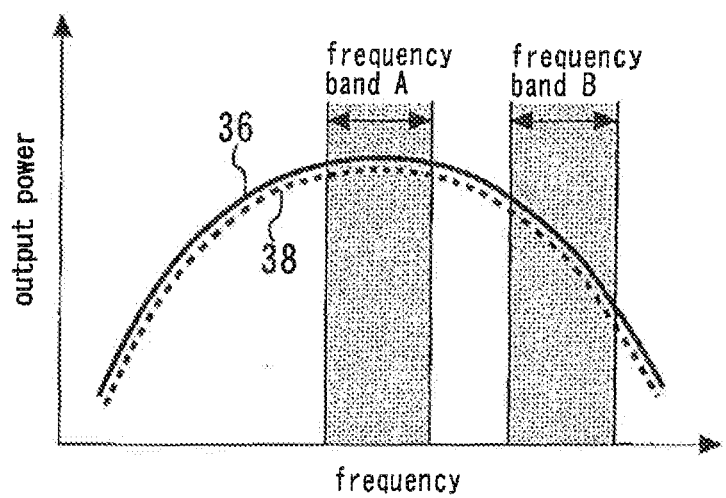
FIG. 6 is a graph of the output power of a semiconductor device similar to the semiconductor device of the second embodiment, but wherein the third capacitors are omitted and the plurality of second capacitors have the same capacitance.
Figure 7:
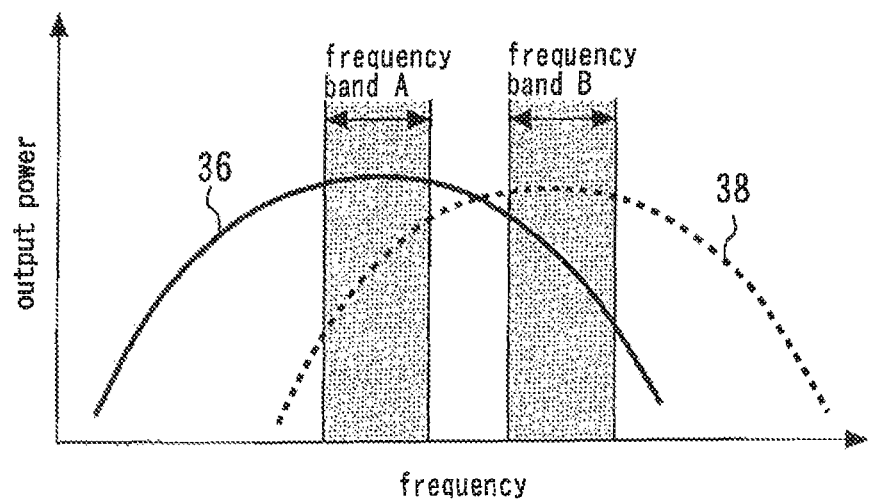
FIG. 7 is a graph of the output power of the semiconductor device shown in FIG. 5 as a function of frequency.

FIGS. 6 and 7 are graphs showing the output power of two semiconductor devices (namely, multiband amplifiers) as a function of frequency, showing frequency characteristics of these semiconductor devices. Specifically, FIG. 6 is a graph of the output power of a semiconductor device similar to the semiconductor device 100 of the second embodiment, but wherein the third capacitors 112 and 114 are omitted and the plurality of second capacitors 40 have the same capacitance. Referring to FIG. 6, the curve labeled 36 represents the power of the signal output from the output path 36 as a function of frequency, and the curve labeled 38 represents the power of the signal output from the output path 38 as a function of frequency. It should be noted that, through the action of the switch 32, only RF signals in frequency band A are input to the output path 36, and only RF signals in frequency band B are input to the output path 38.

Since, as shown in FIG. 6, the frequency characteristic curves 36 and 38 are identical to each other, there is no way to enhance the output power of the RF signals in both frequency bands concurrently. The only way to overcome this problem, i.e., to enhance the output power of the RF signals in frequency band B shown in FIG. 6, is to increase the size of the semiconductor device.

FIG. 7, on the other hand, is a graph of the output power of the semiconductor device 100 shown in FIG. 5 as a function of frequency. In the semiconductor device 100, the capacitances of the second capacitors 42 and 44 and the third capacitors 112 and 114 are such that the output paths 36 and 38 exhibit optimum RF characteristics, as described above. In other words, in the semiconductor device 100, a second capacitor and a third capacitor are connected to each of the plurality of output paths 34, which receive RF signals in different frequency bands, and the capacitances of these second and third capacitors are selected such that each of the plurality of output paths 34 exhibits optimum RF characteristics. As shown in FIG. 7, in the semiconductor device 100, the power of the RF signals in frequency bands A and B output from the output paths 36 and 38, respectively, is maximized, eliminating the need to increase the size of the semiconductor device 100.

Thus, in the semiconductor device 100 of the second embodiment, a second capacitor and a third capacitor are connected to each of the plurality of output paths 34, and the capacitances of these second and third capacitors are selected so as to optimize the output power of the semiconductor device 100 over the operating frequency range. In this way the optimization is easier to accomplish than is the case when only a second capacitor is connected to each of the plurality of output paths 34 and its capacitance is selected.

It should be noted that the third capacitors 112 and 114 may be omitted from the semiconductor device 100 of the second embodiment, and the capacitances of the second capacitors 42 and 44 may be selected so as to optimize the output power of the semiconductor device 100 over the operating frequency range. In such cases, the second capacitors connected to the plurality of output paths 34 may have differing capacitances in such a way that second capacitors connected to output paths for transmitting RF signals in lower frequency bands have greater capacitances than second capacitors connected to output paths for transmitting RF signals in higher frequency bands.

It should be noted that features of the semiconductor device 10 of the first embodiment and the semiconductor device 100 of the second embodiment may be combined where appropriate.

Thus, the present invention provides a semiconductor device in which a first capacitor is connected to the input of a switch and a plurality of second capacitors are connected to the outputs of the switch, wherein the switch and the first and second capacitors are integrally formed as an MMIC, and/or the capacitance of the first capacitance is selected to be larger than the capacitances of the second capacitors, to thereby reduce the size of the semiconductor device.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
a power amplifier for amplifying RF signals in a plurality of frequency bands;
an output matching circuit connected to an output of said power amplifier;
a first capacitor connected at a first end to an output of said output matching circuit;
a plurality of output paths;
a switch connected to a second end of said first capacitor and directing each of the RF signals to one of said plurality of output paths in accordance with frequency band of each of the RF signals; and
a plurality of second capacitors, each second capacitor being connected in series to a respective one of said output paths, wherein
capacitance of said first capacitor is larger than capacitance of any of said second capacitors,
the capacitance of said first capacitor and the capacitances of said second capacitors satisfy the following equation:

$$0.8\sqrt{N} \cdot C_{OUT\_k} \leq C_{IN} \leq 1.2\sqrt{N} \cdot C_{OUT\_k}$$

where $C_{IN}$ is the capacitance of said first capacitor, $C_{OUT\_k}$ is the capacitance of a kth one of said second capacitors, $k=1, 2, \ldots, N$, and N is the number of said second capacitors.

2. The semiconductor device according to claim 1, wherein said switch and either said first capacitor or said plurality of second capacitors, or both of said first capacitor and said plurality of second capacitors, are integrated as a single monolithic microwave integrated circuit.

3. The semiconductor device according to claim 2, wherein said monolithic microwave integrated circuit is located on a layer of silicon that is disposed on an insulating film.

4. The semiconductor device according to claim 1, wherein
the capacitance of said first capacitor and the capacitances of said second capacitors are selected to maximize combined capacitance of said first capacitor and said plurality of second capacitors, and
total area occupied by said first capacitor and by said plurality of second capacitors is a fixed predetermined value.

5. The semiconductor device according to claim 1, wherein respective second capacitors of said plurality of second capacitors have respective different capacitances and second capacitors connected to output paths transmitting lower frequency band RF signals have larger capacitances than second capacitors connected to output paths for transmitting higher frequency band RF signals.

6. The semiconductor device according to claim 1, further comprising a plurality of third capacitors, each third capacitor being connected between a respective one of said output paths and ground, wherein capacitances of said second capacitors and capacitances of said third capacitors are selected to optimize output power of said semiconductor device over the plurality of frequency bands.

7. The semiconductor device according to claim 1, wherein said switch is a high electron mobility transistor.

8. A semiconductor device comprising:
a power amplifier for amplifying RF signals in a plurality of frequency bands;
an output matching circuit connected to an output of said power amplifier;
a first capacitor connected at a first end to an output of said output matching circuit;
a plurality of output paths;
a switch connected to a second end of said first capacitor and directing each of the RF signals to one of said plurality of output paths in accordance with frequency band of each of the RF signals;
a plurality of second capacitors, each second capacitor being connected in series to a respective one of said output paths, wherein capacitance of said first capacitor is larger than capacitance of any of said second capacitors;
a first protection circuit connected between a signal path for the RF signals and ground so an electrostatic discharge (ESD) surge flows to ground;
a power terminal for applying a DC voltage to said switch; and
a second protection circuit connected between said signal path and said power terminal so an ESD surge flows to ground through said signal path and said first protection circuit.

9. The semiconductor device according to claim 8, further comprising a plurality of third protection circuits for passing an ESD surge therethrough, wherein one of said third protection circuits are connected in parallel with said first capacitor, and all other third protection circuits are connected in parallel with respective ones of said second capacitors.

10. The semiconductor device according to claim 9, wherein said first, second, and third protection circuits include a diode or field effect transistor.

11. The semiconductor device according to claim 8, wherein respective second capacitors of said plurality of second capacitors have respective different capacitances and second capacitors connected to output paths transmitting lower frequency band RF signals have larger capacitances than second capacitors connected to output paths for transmitting higher frequency band RF signals.

12. The semiconductor device according to claim 8, further comprising a plurality of third capacitors, each third capacitor being connected between a respective one of said output paths and ground, wherein capacitances of said second capacitors and capacitances of said third capacitors are selected to optimize output power of said semiconductor device over the plurality of frequency bands.

13. The semiconductor device according to claim 8, wherein said switch and either said first capacitor or said plurality of second capacitors, or both of said first capacitor and said plurality of second capacitors, are integrated as a single monolithic microwave integrated circuit.

14. The semiconductor device according to claim 13, wherein said monolithic microwave integrated circuit is located on a layer of silicon that is disposed on an insulating film.

15. The semiconductor device according to claim 8, wherein said switch is a high electron mobility transistor.

16. The semiconductor device according to claim 8, wherein
the capacitance of said first capacitor and the capacitances of said second capacitors are selected to maximize combined capacitance of said first capacitor and said plurality of second capacitors, and
total area occupied by said first capacitor and by said plurality of second capacitors is a fixed predetermined value.

* * * * *